United States Patent
Lee et al.

(10) Patent No.: US 10,483,025 B2
(45) Date of Patent: Nov. 19, 2019

(54) SUPERCONDUCTIVE COIL MODULE INCLUDING A SHAKING COIL

(71) Applicant: Korea University Research and Business Foundation, Seoul (KR)

(72) Inventors: Hai Gun Lee, Seoul (KR); Kwang Lok Kim, Gyeonggi-do (KR); Seong Gyeom Kim, Gyeonggi-do (KR)

(73) Assignee: Korea University Research and Business Foundation, Seoul (KR)

( * ) Notice: Subject to any disclaimer, the term of this patent is extended or adjusted under 35 U.S.C. 154(b) by 359 days.

(21) Appl. No.: 15/421,617

(22) Filed: Feb. 1, 2017

(65) Prior Publication Data

US 2017/0221620 A1    Aug. 3, 2017

(30) Foreign Application Priority Data

Feb. 3, 2016    (KR) .................. 10-2016-0013393

(51) Int. Cl.
*H01F 6/06* (2006.01)
*G01R 33/3815* (2006.01)

(52) U.S. Cl.
CPC ........... *H01F 6/06* (2013.01); *G01R 33/3815* (2013.01)

(58) Field of Classification Search
None
See application file for complete search history.

(56) References Cited

U.S. PATENT DOCUMENTS 5,412,363 A    5/1995    Breneman et al.

FOREIGN PATENT DOCUMENTS

| EP | 0770882 A1 | 5/1997 |
| EP | 1440327 A1 | 7/2004 |
| KR | 10-1385746 A | 4/2014 |
| WO | 10-1385746 A1 | 4/2014 |

OTHER PUBLICATIONS

Kajikawa et al.("Reduction of Magnetization in Windings Composed of HTS Tapes", IEEE Transactions on Applied Superconductivity, vol. 22, No. 3, Jun. 2012.*

* cited by examiner

*Primary Examiner* — Colleen P Dunn
(74) *Attorney, Agent, or Firm* — Fox Rothschild LLP

(57) ABSTRACT

A superconductive coil module includes a superconductive coil a superconductive coil and a shaking coil. The superconductive coil includes a bobbin having a cylindrical shape, and a superconductive wire member of superconductive property, which surrounds an outer circumferential surface of the bobbin. The superconductive coil is configured to generate a magnetic field along a radial direction in case of a charging event. The shaking coil is disposed adjacent to the superconductive wire member, and is configured to generate an alternating magnetic field to decrease a magnitude of a screening current induced magnetic field formed in the superconductive wire member. Thus, the superconductive coil module includes the shaking coil to decrease the magnitude of a screening current induced magnetic field formed in the superconductive wire member using a voltex shaking effect to maintain a central magnetic field uniform.

5 Claims, 4 Drawing Sheets

[Fig. 1]
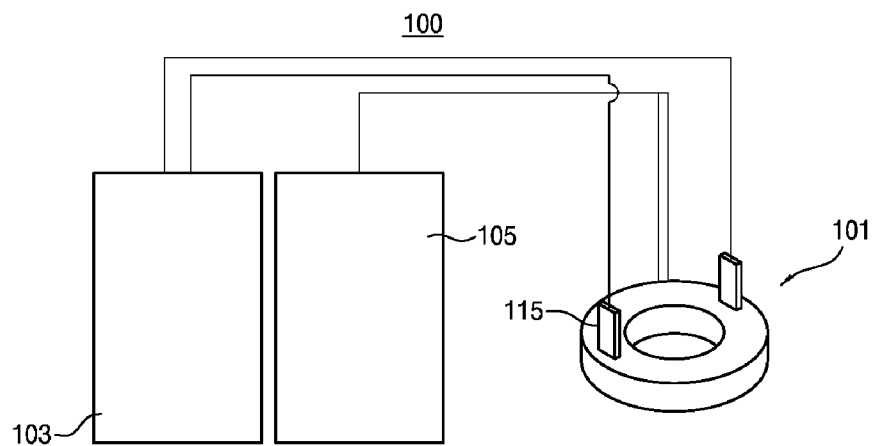
[Fig. 2]
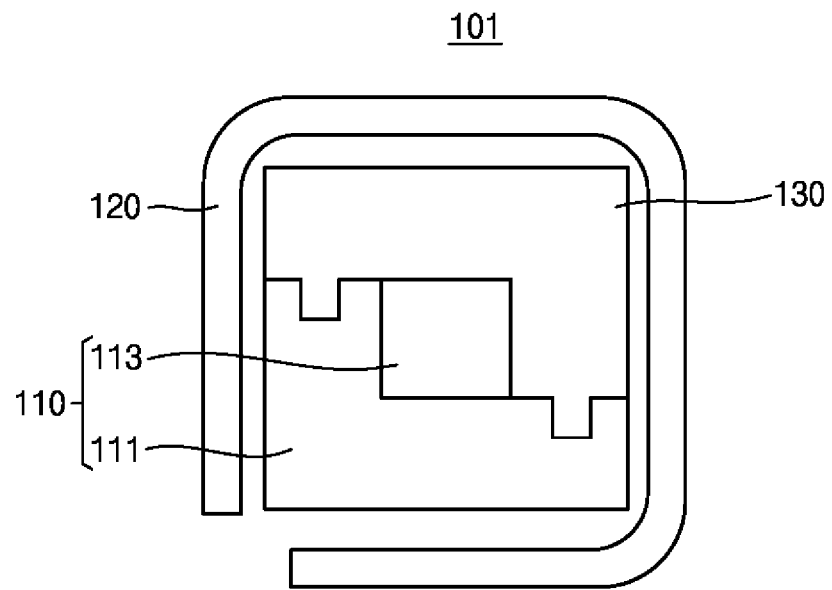

[Fig. 3]
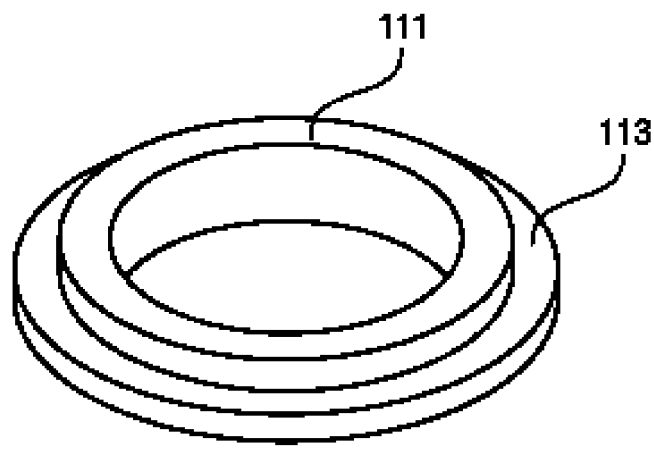
[Fig. 4]
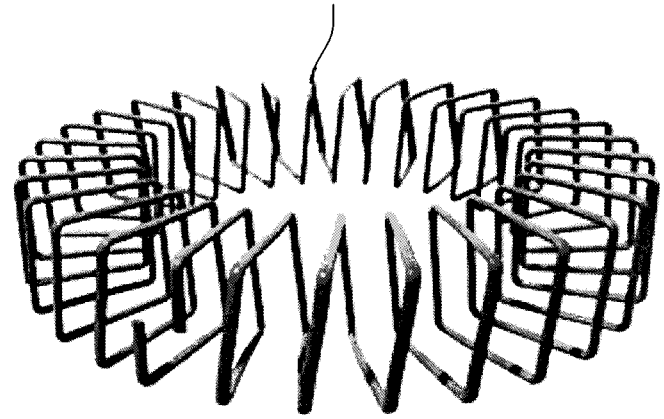

[Fig. 5]
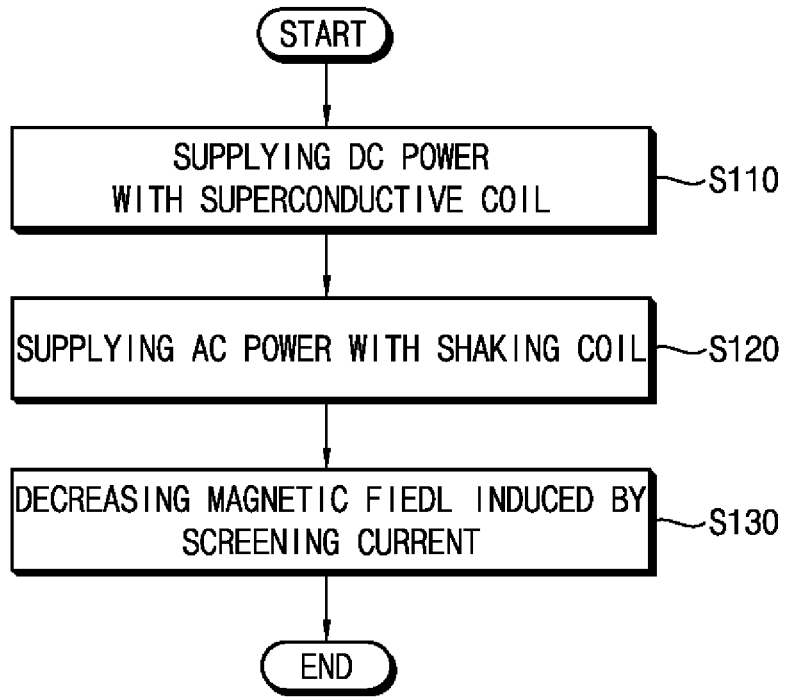
[Fig. 6]
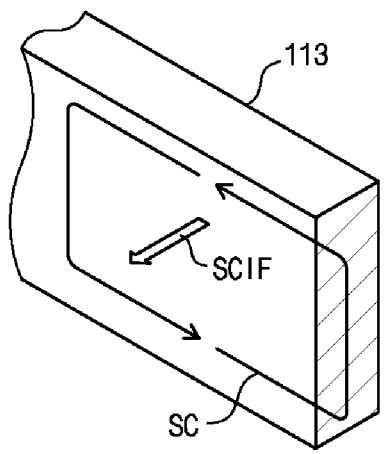

[Fig. 7]
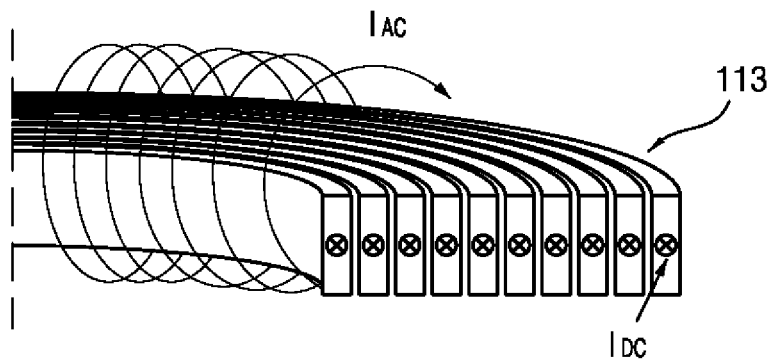
[Fig. 8]
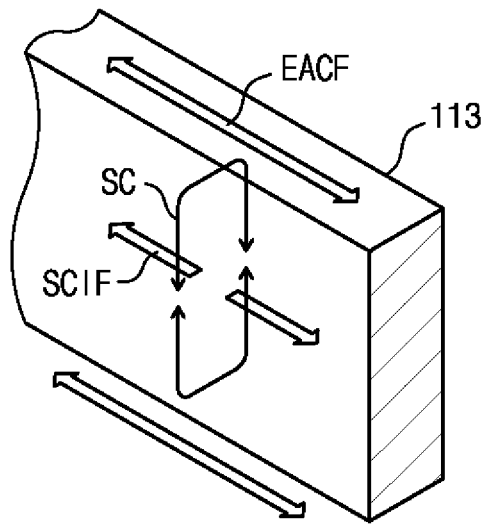

SUPERCONDUCTIVE COIL MODULE INCLUDING A SHAKING COIL

PRIORITY STATEMENT

This application claims priority under 35 U.S.C. § 119 to Korean Patent Application No. 10-2016-0013393, filed on Feb. 3, 2016 in the Korean Intellectual Property Office (KIPO), the contents of which application are herein incorporated by reference in its entirety.

BACKGROUND

1. Field of Disclosure

The present document relates to a superconductive coil module including a shaking coil. More specifically, the present document relates to a superconductive coil module including a shaking coil having a superconductive wire member of a high temperature superconductor for being utilized for a nuclear magnetic resonance apparatus and a magnetic resonance imaging apparatus.

2. Description of Related Technology

A superconductive coil includes a superconductive wire member consisting of a superconductive material to make a significant magnetic field around, thus to be referred as superconductor because its electrical resistance decreases to reach zero under a critical temperature. Further, a high temperature superconductor does not follow BSC theory related to the superconductor and has s superconductive property at a temperature of below 30 K.

The high temperature superconductor can be stored using liquid nitrogen instead of liquid helium as a coolant to significantly save a cooling cost for cooling the superconductor and can be adapted to an analysis equipment such as a nuclear magnetic resonance apparatus or a medical equipment such as a magnetic resonance imaging apparatus, etc.

A second generation high temperature superconductive coil includes a high temperature superconductive wire member. The high temperature superconductive wire member includes a metal substrate, a buffer layer coated on a surface of the metal substrate and a superconductive layer deposited on the buffer layer. The high temperature superconductive wire member may have a critical current density of over about 1 MA/cm2 without a current loss.

The second generation high temperature superconductive coil including the high temperature superconductive wire member can generate a radial magnetic field at the event of charge to be applicable to various technical fields.

However, in case of the second generation high temperature superconductive coil the radial magnetic field fluxes through the second generation high temperature superconductive coil such that a screening current may occur in the superconductive wire member to weaken a magnitude of the radial magnetic field. The screening current continuously flows at a peripheral portion of the superconductive wire member in case of the charging and the discharging of the superconductive coil. Therefore, the screening current which permanently flows in the superconductor coil may induce a screening current induced magnetic field which fluxed along a direction opposite to the radial magnetic field. The screening current induced magnetic field may not decrease until the coolant is removed to make the superconductive coil lose a superconductive property. In particular, as the second generation superconductive coil is repeatedly charged and discharge, the screening current induced magnetic field which remains in the superconductive coil may have effect on the central magnetic field of the superconductive coil as a whole. Thus, it is necessary to remove the screening current induced magnetic field in case of the nuclear magnetic resonance equipment or the magnetic resonance equipment.

SUMMARY

The present document is directed to a superconductive coil module including a shaking coil being capable of effectively decreasing a screening current induced magnetic field using a voltex shaking effect.

In some scenarios, a superconductive coil module includes a superconductive coil a superconductive coil and a shaking coil. The superconductive coil includes a bobbin having a cylindrical shape, and a superconductive wire member of superconductive property, which surrounds an outer circumferential surface of the bobbin. The superconductive coil is configured to generate a magnetic field along a radial direction in case of a charging event. The shaking coil is disposed adjacent to the superconductive wire member, and is configured to generate an alternating magnetic field to decrease a magnitude of a screening current induced magnetic field formed in the superconductive wire member.

In those or other scenarios, the shaking coil may generate the alternating magnetic field along a direction parallel to an extension direction of the superconductive wire member and in a region outside of the superconductive wire member.

In those or other scenarios, the shaking coil may surround the superconductive coil with a co-axis of the superconductive coil to have a toroidal shape.

In those or other scenarios, the superconductive coil module may further include a spacer being interposed between the superconductive wire member and the shaking coil, and being configured to prevent an electrical short between the superconductive wire member and the shaking coil.

In those or other scenarios, the shaking coil may include copper.

In those or other scenarios, the shaking coil may include a second generation high temperature superconductive coil.

In those or other scenarios, the superconductive coil module includes the shaking coil to make an alternating current along a direction parallel to an extension direction of the superconductive wire member. As a result, the alternating magnetic field fluxes vertically to the screening current induced magnetic field to decrease the screening current induced magnetic field. Therefore, a central magnetic field of the superconductive coil may be uniformly maintained to effectively operate the superconductive apparatus such as the nuclear magnetic resonance apparatus and the magnetic resonance imaging apparatus.

BRIEF DESCRIPTION OF THE DRAWINGS

The above and other features and advantages will become more apparent by describing exemplary embodiments thereof with reference to the accompanying drawings, in which:

FIG. 1 is a schematic diagram illustrating an operating principle of a superconductive coil module;

FIG. 2 is a cross-sectional view illustrating a superconductive coil module;

FIG. 3 is a perspective view illustrating a superconductive coil in FIG. 2;

FIG. 4 is a perspective view illustrating a shaking coil in FIG. 2;

FIG. 5 is a flow chart illustrating a process in which a superconductive coil module in FIG. 1 decreases a magnetic field induced by a screening current;

FIG. 6 is a perspective view illustrating a screening current and a magnetic field induced by the screening current at step S110 in FIG. 5;

FIG. 7 is a perspective view illustrating an alternating current formed around a superconductive coil by an operation of a shaking coil at step S120 in FIG. 5; and FIG. 8 is a perspective view illustrating a principle of decreasing a screening current by an operation of a shaking coil at step S130 in FIG. 5.

DETAILED DESCRIPTION

Hereinafter, embodiments of the invention will be explained in detail with reference to the accompanying drawings. While the invention is susceptible to various changes have to be introduced in various forms and may have a bar, and the specific embodiments illustrated in the drawings shall be explained in detail in the text. However, it is disclosed in a particular form of the present invention is not intended to limit, the spirit and technical scope of the present invention includes all modifications, equivalents and substitutes should be understood to include. Accompanying drawings, the dimensions of the structure of the present invention larger than actual in order to clarity the group shown in the drawings.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

Use of a term in the present application for the purpose of describing particular embodiments only be used, and are not intended to limit the invention. Yield a clearly different meaning in the context of the expression of the plural, unless expressed and the like. In the present application, "including" or "having" and the like is intended to set forth features, integers, steps, operations, elements, parts or combinations not possible specify the presence of one or more other features, integers, steps, operations, elements, parts or combinations of those present in or added are not intended to preclude the possibility must be.

Unless otherwise defined, including technical and scientific terms used herein, all terms are to the present invention is not skilled in the art as commonly understood by one party the same meaning. The commonly used terms such as those defined in advance in the context of the related art having the meanings and shall be construed to have a meaning consistent and, in this application, unless otherwise defined explicitly, ideal or excessively formal meaning to be construed not.

FIG. 1 is a schematic diagram illustrating an operating principle of a superconductive coil module. FIG. 2 is a cross-sectional view illustrating a superconductive coil module.

Referring to FIGS. 1 and 2, a superconductive apparatus 100 includes a superconductive coil module 101 having a shaking coil. The superconductive apparatus 100 such as a nuclear magnetic resonance apparatus and a magnetic resonance imaging apparatus may be required to have a high uniformity of a central magnetic field. Thus, the superconductive apparatus 100 includes a superconductive coil module 101 for forming a strong magnetic field using a superconductive phenomenon, a direct power source 103 and an alternating power source 105 for driving the superconductive coil module 101.

The superconductive coil module 101 may correspond to a substantial driving part for the superconductive apparatus such as the nuclear magnetic resonance apparatus and the magnetic resonance imaging apparatus in order to perform a charging or a discharging. The superconductive coil module 101 includes a superconductive coil 110 and a shaking coil 120. The superconductive coil 110 generates a magnetic field by being supplied with a DC power from the direct power source 103. The shaking coil 120 may be configured to decrease a magnetic field induced by a screening current formed around the superconductive coil 110.

In some scenarios, the superconductive coil module 101 may have a stacked structure including a plurality of pencake sheets having a ring shape, respectively. A shape and an arrangement of the superconductive coil module 101 may not be restricted.

FIG. 3 is a perspective view illustrating a superconductive coil in FIG. 2. FIG. 4 is a perspective view illustrating a shaking coil in FIG. 2.

Referring to FIGS. 1 to 3, the superconductive coil 110 includes a bobbin 111 having a cylindrical shape and a superconductive wire member 113 surrounding a circumferential surface of the bobbin 111. The superconductive wire member 113 has a superconductive property. The superconductive wire member 113 may be electrically connected to a current inlet portion 115. The current inlet portion 115 is externally exposed for driving the superconductive coil 110 and is electrically connected to the direct power source 103, thus to supply the direct power to the superconductive wire member 113. The superconductive wire member 113 is capable of be charged by the direct power to generate a radial magnetic field which is formed along a radial direction with respect to a central axis of the superconductive wire member 113.

In some scenarios, the superconductive coil 110 may include a second generation high temperature superconductive coil. Thus, the superconductive wire member 113 may include a material of being preventing from a physical deformation or a physical damage at a temperature between an evaporation point of liquid nitrogen (about 77 K) and an evaporation point of liquid helium (about 4.2 K).

In case of charging the superconductive coil 110, the radial magnetic field fluxes through the superconductive coil 110 to generate a screening current inside of the superconductive wire member 113. The screening current may generate a magnetic field along a direction opposite to a direction of the radial magnetic field. The magnetic field is induced by the screening current. The magnetic field may deteriorate a uniformity of a central magnetic field of the superconductive coil 110. Hereinafter, the magnetic field is referred to as screening current induced magnetic field.

The superconductive coil module 101 includes the shaking coil 120 being configured to decrease a magnitude of the screen current induced magnetic field.

Referring to FIGS. 2 and 4, the shaking coil 120 may be capable of decreasing the magnitude of the screen current induced magnetic field using a voltex shaking effect.

In particular, the shaking coil 120 is disposed adjacent to the superconductive coil 113. The shaking coil 120 may generate an alternating magnetic field around the superconductive coil 110 for a filed shaking effect, while being supplied with the alternating power from the alternating power source 105 (see FIG. 1). The alternating magnetic field fluxed outside of the superconductive coil 110 and along a direction parallel to an extension direction of the superconductive wire member 113. As a result, the screening current induced magnetic field may be weakened due to the alternating magnetic field which fluxes vertically to the screening current induced magnetic field. Therefore, the screening current induced magnetic field which is formed inside of the superconductive wire member 113 may decrease to maintain the central magnetic field of the superconductive coil 110 uniformly to effectively operate the superconductive apparatus such as the nuclear magnetic resonance apparatus and the magnetic resonance imaging apparatus.

The shaking coil 120 may include a wire consisting of copper. The wire may have an enamel thin film coated on a surface thereof. The material being composed of the wire of the shaking coil 120 may not be restricted. Further, the wire of the shaking coil 120 have a variable thickness, considering a magnitude of the alternating current which flows along the shaking coil 120.

In some scenarios, the shaking coil 120 may have a toroidal shape. Further, the shaking coil 120 may surrounds the superconductive coil 110 with a co-axis of the superconductive coil 110. As shown in FIG. 2, the shaking coil 120 may be disposed adjacent to the superconductive coil 110 as near as possible.

In some scenarios, the superconductive coil module 101 may further include a spacer 130 interposed between the superconductive wire member 113 and the shaking coil 120. The spacer 130 may maintain a suitable distance between the superconductive wire member 113 and the shaking coil 120. Thus, the spacer 130 may prevent an electric short between the superconductive wire member 113 and the shaking coil 120.

Hereinafter, a mechanism of decreasing the screening current induced magnetic field by the shaking coil 120 when the superconductive coil 110 is charged is in detail described FIG. 5 is a flow chart illustrating a process in which a superconductive coil module in FIG. 1 decreases a magnetic field induced by a screening current. FIG. 6 is a perspective view illustrating a screening current and a magnetic field induced by the screening current at step S110 in FIG. 5.

Referring to FIGS. 2, 5, and 6, the direct power source 103 (see FIG. 1) supplies the direct power for the superconductive wire member 113 to charge the superconductive coil 110 (step S110). When charging the superconductive coil 110, the radial magnetic field occurs through the superconductive coil 110. Thus, as shown in FIG. 6, the screening current SC flow in the superconductive wire member 113 to generate the screening current induced magnetic field SCIF along the direction opposite to the direction of the redial magnetic field. The screening current induced magnetic field SCIF fluxes along a thickness direction of the superconductive wire member 113 through the superconductive wire member 113 as shown in FIG. 6, to deteriorate a uniformity of the central magnetic field of the superconductive coil 110.

In order to prevent the central magnetic field of the superconductive coil 110 from deteriorating, the shaking coil 120 receives the alternating power from the alternating power source 105 (see FIG. 1) to make the alternating current to flow adjacent to the superconductive coil 110 (step S120).

FIG. 7 is a perspective view illustrating an alternating current formed around a superconductive coil by an operation of a shaking coil at step S120 in FIG. 5. FIG. 8 is a perspective view illustrating a principle of decreasing a screening current by an operation of a shaking coil at step S130 in FIG. 5.

Referring to FIGS. 2, 5, 7 and 8, when the alternating current is applied to the shaking coil 120, the alternating current IAC flows in the shaking coil 120. Further, the alternating current IAC flows adjacent to the superconductive wire member 113 in which the direct current IDC flows as shown in FIG. 7.

As a result, an alternating current magnetic field EACF fluxes outside of the superconductive wire member 113 to alleviate the screening current induced magnetic field SCIF (step S130).

In detail, the alternating current magnetic field EACF formed by the shaking coil 120 fluxes in a direction parallel to the extension direction of the superconductive wire member 113 to remove the screening current induced magnetic field SCIF vertical with respect to the alternating current magnetic field EACF due to the voltex shaking effects. Therefore, the direction of each of the screening current SC and the screening current induced magnetic field SCIF varies with the respect to the direction of each of the screening current SC and the screening current induced magnetic field SCIF before the operation of the shaking coil 120 such that the screening current induced magnetic field SCIF fluxed along a varied direction substantially identical to that of the alternating current magnetic field. As a result, the screening current induced magnetic field SCIF may have a decreased magnitude owing to the alternating current magnetic field not to effect on the central magnetic field of the superconductive coil 110 to keep the central magnetic field of the superconductive coil 110 uniformly.

The foregoing is illustrative of the present teachings and is not to be construed as limiting thereof. Although a few exemplary embodiments have been described, those skilled in the art will readily appreciate from the foregoing that many modifications are possible in the exemplary embodiments without materially departing from the novel teachings and advantages of the present disclosure of invention. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A superconductive coil module comprising:
   a superconductive coil including a bobbin having a cylindrical shape, and a superconductive wire member of superconductive property, surrounding an outer circumferential surface of the bobbin, the superconductive coil being configured to generate a magnetic field along a radial direction in case of a charging event;
   a shaking coil being disposed adjacent to the superconductive wire member, and being configured to generate an alternating magnetic field to decrease a magnitude of a screening current induced magnetic field formed in the superconductive wire member; and
   a spacer being interposed between the superconductive wire member and the shaking coil, and being configured to prevent an electrical short between the superconductive member and the shaking coil.

2. The superconductive coil module of claim 1, wherein the shaking coil generates the alternating magnetic field along a direction parallel to an extension direction of the superconductive wire member and in a region outside of the superconductive wire member.

3. The superconductive coil module of claim 1, wherein the shaking coil surrounds the superconductive coil with a co-axis of the superconductive coil to have a toroidal shape.

4. The superconductive coil module of claim 1, wherein the shaking coil include copper.

5. The superconductive coil module of claim 1, wherein the superconductive coil includes a second generation high temperature superconductive coil.

\* \* \* \* \*